United States Patent
Kato et al.

(10) Patent No.: US 7,807,515 B2
(45) Date of Patent: Oct. 5, 2010

(54) OXIDE SEMICONDUCTOR, THIN-FILM TRANSISTOR AND METHOD FOR PRODUCING THE SAME

(75) Inventors: Hisato Kato, Hachioji (JP); Haruo Kawakami, Miura (JP); Nobuyuki Sekine, Hachioji (JP); Kyoko Kato, Zushi (JP)

(73) Assignee: Fuji Electric Holding Co., Ltd., Kawasaki-Shi, Kanagawa-Ken (JP)

( * ) Notice: Subject to any disclaimer, the term of this patent is extended or adjusted under 35 U.S.C. 154(b) by 57 days.

(21) Appl. No.: 12/086,628

(22) PCT Filed: May 25, 2007

(86) PCT No.: PCT/JP2007/060686
§ 371 (c)(1),
(2), (4) Date: Aug. 8, 2008

(87) PCT Pub. No.: WO2007/139009
PCT Pub. Date: Dec. 6, 2007

(65) Prior Publication Data
US 2009/0289249 A1 Nov. 26, 2009

(30) Foreign Application Priority Data
May 25, 2006 (JP) .............................. 2006-144946

(51) Int. Cl.
*H01L 21/00* (2006.01)
*H01L 21/84* (2006.01)

(52) U.S. Cl. ........................ 438/149; 438/197; 438/513; 257/E21.051; 257/E21.077; 257/E21.081; 257/E21.311; 257/E21.4; 257/E21.411

(58) Field of Classification Search .................... 438/30, 438/91, 96, 97, 149, 197, 509, 513; 257/359, 257/E21.051, 77, 81, 311, 352, 411
See application file for complete search history.

(56) References Cited

U.S. PATENT DOCUMENTS 6,750,352 B2 * 6/2004 Ono et al. ................. 548/341.5
2008/0050581 A1 * 2/2008 Miwa et al. .................. 428/332

FOREIGN PATENT DOCUMENTS

| JP | 2000-044236 | 2/2000 |
| JP | 2006-013433 | 1/2006 |
| JP | 2007-123699 | 5/2007 |
| JP | 2007-142196 | 6/2007 |

OTHER PUBLICATIONS

Nature/vol. 432, published on Nov. 25, 2004, pp. 488-492, "Room-temperature fabrication of transparent flexible thin-film transistors using amorphous oxide semiconductors" by Kenji Nomura, Hiromichi Ohta, Akihiro Takagi, Toshiko Kamiya, Masahiro Hirano, and Hideo Hosono.

* cited by examiner

*Primary Examiner*—David Nhu
(74) *Attorney, Agent, or Firm*—Manabu Kanesaka

(57) ABSTRACT

Disclosed is an oxide semiconductor having an amorphous structure, wherein higher mobility and reduced carrier concentration are achieved. Also disclosed are a thin film transistor, a method for producing the oxide semiconductor, and a method for producing the thin film transistor. Specifically disclosed is an oxide semiconductor which is characterized by being composed of an amorphous oxide represented by the following a general formula: $In_{x+1}MZn_{y+1}Sn_zO_{(4+1.5x+y+2z)}$ (wherein M is Ga or Al, $0 \leq x \leq 1$, $-0.2 \leq y \leq 1.2$, $z \geq 0.4$ and $0.5 \leq (x+y)/z \leq 3$). This oxide semiconductor is preferably subjected to a heat treatment in an oxidizing gas atmosphere after film formation. Also specifically disclosed is a thin film transistor which is characterized by comprising the oxide semiconductor.

5 Claims, 1 Drawing Sheet

OXIDE SEMICONDUCTOR, THIN-FILM TRANSISTOR AND METHOD FOR PRODUCING THE SAME

RELATED APPLICATIONS

The present application is based on International Application No. PCT/JP07/060686, filed on May 25, 2007, and claims priority from, Japanese Application Number 2006-144946, filed May 25, 2006, the disclosure of which is hereby incorporated by reference herein in its entirety.

TECHNICAL FIELD

The present invention relates to an oxide semiconductor, a thin-film transistor, a method for producing the oxide semiconductor, and a method for producing the thin-film transistor.

BACKGROUND ART

Flat displays for information apparatuses have become widespread remarkably in recent years. Among them, a liquid crystal display performs on/off control of light of a backlight unit by using the optical shuttering function of liquid crystal and obtains color by using color filters. On the contrary, an organic EL display (or an organic LED display) has not only an advantage such that the viewing angle is wide because each pixel emits light individually (that is, self-emits light), but also many advantages such that the display can be made thin and formed on a flexible substrate because there is no backlight unit required. For this reason, the organic EL display is expected as a next-generation display.

Methods for driving these display panels can be roughly classified into two groups. The first drive method is called passive matrix type (or duty drive method, simple matrix method). This is a method in which stripe electrodes are combined in rows and columns like a matrix so that a pixel located at an intersection of a certain row and column is made to emit light by a drive signal applied to a row electrode and column electrode. The signal for light emission control is generally scanned in time series on each row in the row direction and applied to respective columns simultaneously on the same row. This is a method in which each pixel is generally provided with no active element so that each pixel is controlled to emit light only in the duty period of each row in the scanning period of the row.

The second drive method is called active matrix type in which each pixel is provided with a switching element so that the pixel can emit light in the scanning period of a row. For example, assume the case where the whole surface of a panel having 100 rows and 150 columns is made to emit light at display luminance of 100 $Cd/m^2$. In this case, in the active matrix type, each pixel can be made to emit light at 100 $Cd/m^2$ simply if the area ratio of each pixel and various kinds of loss are not considered because each pixel fundamentally always emits light. However, in the passive matrix type, when the same display luminance is to be obtained, the light emission luminance in the light-emitting time need to be set at 10000 $Cd/m^2$ which is 100 times higher because the duty ratio for driving each pixel is 1/100 and only the duty period (selection period) is the light emitting time.

Here, the light emission luminance can be increased when a current flowing in a light-emitting element is increased. However, for example, in an organic EL light-emitting element, it is known that light-emitting efficiency decreases as the current increases. In comparison between the active matrix type drive method and the passive matrix drive method at the same display luminance, power consumption in the passive matrix type becomes relatively large because of reduction of this efficiency. Moreover, increase of the current flowing in the organic EL element has a disadvantage that deterioration of material is apt to be caused by heating or the like and the life of the display unit is shortened. On the other hand, if the maximum current is limited from the viewpoints of efficiency and life, the necessity to elongate the light-emitting period occurs in order to obtain the same display luminance. However, the elongation of the light-emitting period lends itself to limitation of display capacity (number of drive lines) because the duty ratio for deciding the light-emitting time in the passive matrix type drive method is the reciprocal of the number of rows in the panel. From these points, it was necessary to use the active matrix type drive method in order to achieve a large-area high-definition panel. As for a basic circuit for general active matrix drive, a method using thin-film transistors as switching elements is known.

In the active matrix type drive method adapted to the large area and high definition, a thin-film transistor (TFT) using polysilicon as a switching element of a pixel is used most widely. However, since polysilicon is a polycrystal, there is a large problem such that in-plane uniformity is poor particularly in a current drive type display such as an organic EL display. Further, in amorphous silicon, in-plane uniformity is good because of the amorphous structure but there arises a problem that the mobility thereof is at most about 1 $cm^2/Vs$ which is not enough to drive the organic EL element.

To cope with such various problems in the background-art display panels, an amorphous oxide semiconductor has been recently proposed as a semiconductor material used for the thin-film transistor.

For example, a field-effect transistor (FET) using an $InGaZnO_4$ film produced as a semiconductor at room temperature has been disclosed in Non-Patent Document 1. In this, it has been disclosed that the $InGaZnO_4$ film as an active layer has an amorphous structure, the field-effect mobility is 8 $cm^2/Vs$ and the mobility measured based on Hall effect is about 12 $cm^2/Vs$.

Further, in Patent Document 1, it has been disclosed that positive ions are injected into an amorphous oxide film represented by $Zn_xM_yIn_zO_{(x+3y/2+3z/2)}$ (in which M is Al or Ga, x/y is 0.2 to 12, and z/y is 0.4 to 1.4) to thereby exhibit electrical conducting property. Non-Patent Document 1: Kenji Nomura and other five, "Room-Temperature Fabrication of Transparent Flexible Thin Film Transistors Using Amorphous Oxide Semiconductors", Nature, vol. 432, pp. 488-492, November 2004

Patent Document 1: JP-A-2000-44236

DISCLOSURE OF THE INVENTION

Problems that the Invention is to Solve

However, in the thin-film transistor using the aforementioned InGaZnO material, the performance thereof is not sufficient so that a semiconductor material having higher mobility is required. It is known that mobility is improved when In or Zn is added to $InGaZnO_4$. When In is added singly, there is a problem that electrical conducting property becomes so large that the material is unsuitable to practical use as a semiconductor because the OFF current increases to make it difficult to reduce the carrier concentration. When Zn is added singly, there is a problem that the material is crystallized easily in a heat-treating process.

Therefore, in consideration of the problems, an object of the present invention is to provide an oxide semiconductor having an amorphous structure having a higher mobility and capable of reducing a carrier concentration, a thin-film transistor, a method for producing the oxide semiconductor, and a method for producing the thin-film transistor.

Means for Solving the Problems

To achieve the foregoing object, the oxide semiconductor according to the present invention is characterized by being composed of amorphous oxide represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, and $0.5 \leq (x+y)/z \leq 3$).

The thin-film transistor according to the invention is characterized by including the aforementioned oxide semiconductor.

The method for producing an oxide semiconductor according to the invention is characterized by including the steps of: forming amorphous oxide represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, and $0.5 \leq (x+y)/z \leq 3$); and heat-treating the amorphous oxide under an oxidizing gas atmosphere. Preferably, the oxidizing gas at least contains oxygen radical, oxygen, water or ozone.

The method for producing a thin-film transistor according to the invention is characterized by including the steps of: forming amorphous oxide represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, and $0.5 \leq (x+y)/z \leq 3$) on a gate insulating film or on source and drain electrodes; and heat-treating the amorphous oxide under an oxidizing gas atmosphere.

EFFECT OF THE INVENTION

The present inventors have found that when Sn is added singly, Sn has a function of reducing the OFF current while keeping the mobility. Accordingly, it can be conceived that improvement of the mobility can be achieved while the OFF current is kept low when In and Sn are added simultaneously. Moreover, in the case of Zn, it can be conceived that when the same amount of Sn is added, $SnZnO_3$ is formed as an amorphous material to thereby make it possible to improve the mobility while keeping the amorphous state. It can be also conceived that when the amount (x+1) of In and the amount (y+1) of Zn are added in predetermined ranges and the amount (z) of Sn is added together in a predetermined range close to x+y, the mobility is improved while the OFF current is kept low in an amorphous state. The condition concerned with x and y is $0 \leq x \leq 1$ and $-0.2 \leq y \leq 1.2$, and the condition concerned with x, y and z is $\frac{1}{3} \times (x+y) \leq z \leq 2 \times (x+y)$. The last expression can be transformed to $0.5 \leq (x+y)/z \leq 3$.

Accordingly, when oxide having an amorphous structure represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, $0.5 \leq (x+y)/z \leq 3$) is used as the oxide semiconductor, the carrier concentration can be reduced while the mobility is increased, although details of the mechanism thereof are unknown.

Accordingly, when the obtained amorphous oxide is further heat-treated under an oxidizing gas atmosphere, an oxide semiconductor having a low carrier concentration can be obtained stably. This can be conceived because structurally unstable portions are eliminated by heating as well as oxygen holes in the film are compensated by heat-treatment under the oxidizing atmosphere to thereby control the carrier concentration.

As described above, in accordance with the present invention, there can be provided an oxide semiconductor having an amorphous structure having higher mobility and capable of reducing a carrier concentration, a thin-film transistor, a method for producing the oxide semiconductor, and a method for producing the thin-film transistor.

BEST MODE FOR CARRYING OUT THE INVENTION

An embodiment of an oxide semiconductor and a thin-film transistor according to the present invention will be described below with reference to the accompanying drawings. Although the following description will be made in the case where an oxide semiconductor according to the invention is applied to a thin-film transistor by way of example, the oxide semiconductor according to the invention can be applied to various other fields besides the thin-film transistor.

Figure 1:
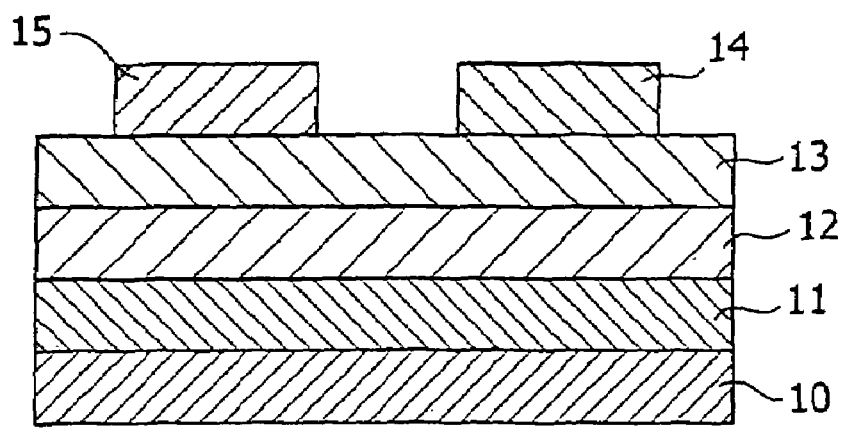
FIG. 1 is a sectional view schematically showing an example of configuration of a thin-film transistor according to the present invention.

FIG. 1 is a sectional view showing an example of configuration of the thin-film transistor according to the invention. As shown in FIG. 1, the thin-film transistor has a gate electrode 11, a gate insulating film 12 and an oxide semiconductor 13 which are formed on a substrate 10 successively. Further, a source electrode 14 and a drain electrode 15 are formed on a surface of the oxide semiconductor 13.

Besides various kinds of glass substrates, a macromolecular film of polyimide, polyether-ether-ketone (PEEK), polyethylene terephthalate (PET), polyether-sulfone (PES), polyether-imide (PEI), or the like can be used as the substrate 10 in accordance with a heat treating condition.

Although any metal can be used as metal used for the gate electrode 11, the metal is decided in consideration of material cost, thin-film formability, adhesiveness to the substrate, stability in the atmosphere, etc. Although examples of the preferred metal from the aforementioned viewpoint include titanium, chromium, cobalt, nickel, copper, aluminum, niobium, tantalum, molybdenum, ITO, etc., the metal is not limited to these examples.

The gate electrode 11 can be formed easily by a vacuum vapor deposition method, a sputtering method or the like. These are patterned by a shadow mask or photo process in accordance with necessity. For example, the gate electrode 11 can be formed in such a manner that an area is limited by a photo resist and then the photo resist is removed, or that a thin film is formed, a photo resist is applied on the thin film, and an unnecessary portion is removed with an appropriate etching solution or the like after exposure and development.

Although metal oxide such as silicon, yttrium, aluminum, hafnium, zirconium or tantalum, composite oxide such as barium strontium titanate, silicon nitride, or the like, can be used as the gate insulating film 12, the material is not limited to these examples. Thin-film formation and patterning of the gate insulating film 12 can be performed easily by sputtering or photolithograph in the same manner as the gate electrode 11.

Oxide having an amorphous structure represented by the general formula $In_{x+1}MZn_{y+1}Sn_zO_{(4+1.5x+y+2z)}$ (M=Ga or Al, $0 \leq x \leq 1$, $-0.2 \leq y \leq 1.2$, $z \geq 0.4$, $0.5 \leq (x+y)/z \leq 3$) is used as the oxide semiconductor film 13. Setting the ratio of In, M (Ga or Al), Zn and Sn in this range makes it possible to obtain an oxide semiconductor film having a higher mobility (preferably, a range of 15 cm$^2$/Vs or more) and capable of reducing the carrier concentration (preferably, reducing the carrier concentration in a range of 10$^{15}$/cm$^3$ or less).

Although a laser ablation method, a sputtering method or the like can be applied to formation of the oxide semiconductor film 13, the method is not limited thereto and various film-forming methods can be applied. For example, when a homologous compound InMZnO$_4$ (M=Ga or Al) is used as a target in a sputtering method and a pellet of SnO$_2$ is put on this target, an Sn-added homologous compound can be obtained. When SnO$_2$ is further added and pellets of metal oxide such as In$_2$O$_3$, Ga$_2$O$_3$ or Al$_2$O$_3$, or ZnO are put thereon, the film composition can be adjusted. After film-forming, patterning can be performed easily by use of photolithograph, shadow mask, etc.

As for the oxide semiconductor film 13, it is possible to obtain a sample having a low carrier concentration according to the film-forming condition but it is preferable that heat treatment is performed under an oxidizing gas atmosphere in order to obtain a sample having a low carrier concentration stably. It is preferable that the oxidizing gas at least contains oxygen radical, oxygen, water, or ozone. Besides general controlled atmosphere heat treatment, a method such as infrared heating or induction heating can be used as the heat-treating method. It is preferable that the heating temperature is 200° C. to 600° C.

A material used for the source electrode 14 and the drain electrode 15 needs to have an energy level matched with that of the oxide semiconductor film 13. Although examples of the preferred material from this viewpoint include gold, chromium, iron, molybdenum, tungsten, copper, ruthenium, rhenium, ITO, etc., the preferred material is not limited thereto. The source electrode 14 and the drain electrode 15 can be formed from these metals by a sputtering method, a vacuum vapor deposition method, etc. and can be patterned easily by photolithography.

Although FIG. 1 shows the case where a bottom gate structure in which the gate electrode 11 forms a bottom layer and the source electrode 14 and the drain electrode 15 form a top layer is used as the structure of the thin-film transistor, the structure is not limited thereto and the invention can be applied to various known structures such as a top gate structure in which the gate electrode is disposed in a top portion, and a vertical structure of a static induction transistor (SIT) or the like. Besides the method in which the oxide semiconductor film 13 is formed on the gate insulating film 12, a method in which the oxide semiconductor film 13 is formed on the source electrode 14 and the drain electrode 15 can be used in this case.

EXAMPLES

Examples 1 to 5

Five kinds of field-effect transistors each having the structure shown in FIG. 1 were produced as follows. First, a silicon wafer with a 100 nm-thick thermal oxide film was used as the substrate. The silicon wafer used was of a highly doped p-type and functioned as a gate electrode. The thermal oxide film functioned as a gate insulating film.

An oxide semiconductor was formed on the thermal oxide film by a high-frequency magnetron sputtering method. A pellet of metal oxide such as In$_2$O$_3$, ZnO or SnO$_2$ with a small diameter was put on InGaZnO$_4$ used as an oxide semiconductor target to thereby adjust the film composition. A condition that the substrate was not heated but put under an argon gas atmosphere at a vacuum of 2 Pa was used as the sputtering condition. The metal atom compositions of the thin films formed thus were evaluated by inductively coupled plasma optical emission spectrometric analysis (ICP). Each film composition as a result of the ICP was shown in Table 1. These thin films were heat-treated at 400° C. in the air for 1 hour in order to reduce the carrier concentration.

Copper vapor deposition films were formed as source electrodes and drain electrodes on these thin films respectively by a shadow mask method to thereby obtain field-effect transistors. The thickness of each electrode was 80 nm. Each channel region between the source electrode and the drain electrode was set to have a channel length (a distance between the source electrode and the drain electrode) of 50 μm and a channel width (a width of each of the source electrode and the drain electrode) of 1 mm. An evaporator used for film-forming was of a diffusion pump discharging type and vapor deposition was performed in a vacuum of 4×10$^{-4}$ Pa (3×10$^{-6}$ torr). The vapor deposition was performed by a resistance heating method at respective film-forming speeds of 10 nm/sec and 0.4 nm/sec. The substrate temperature at film-forming was room temperature.

Comparative Examples 1 to 4

Four kinds of field-effect transistors were produced in the same procedure as that of Examples 1 to 5, except that the kind of pellet of metal oxide put on the target when a film of the oxide semiconductor was formed by sputtering was changed. These film compositions were shown in Table 1.

(Measurement of Mobility and Carrier Concentration)

With respect to each of Examples 1 to 5 and Comparative Examples 1 to 4, field-effect transistor characteristic (drain current) was measured with a picoammeter 6487 (made by Keithley Instruments Inc.) so that FET mobility in a saturation region was obtained from gate voltage-drain current characteristic. Further, a drain current (hereinafter referred to as OFF current) flowing at a gate voltage of 0V was measured as a value proportional to the carrier concentration. Each result was shown in Table 1. A graph showing the relation between film composition (x+y)/z and FET mobility was shown in FIG. 2.

TABLE 1

|  | In/Ga 1 + x | Zn/Ga 1 + y | Sn/Ga z | (x + y)/z | Mobility (cm$^2$/Vs) | OFF Current ×10$^{-8}$ (A) |
| --- | --- | --- | --- | --- | --- | --- |
| Example 1 | 1.72 | 0.83 | 0.79 | 0.70 | 15.0 | 3.9 |
| Example 2 | 1.00 | 2.11 | 0.82 | 1.35 | 16.2 | 1.2 |

TABLE 1-continued

|  | In/Ga $1+x$ | Zn/Ga $1+y$ | Sn/Ga $z$ | $(x+y)/z$ | Mobility $(cm^2/Vs)$ | OFF Current $\times 10^{-8}$ (A) |
|---|---|---|---|---|---|---|
| Example 3 | 1.45 | 1.74 | 0.45 | 2.65 | 17.3 | 5.3 |
| Example 4 | 1.25 | 1.04 | 0.41 | 0.70 | 19.1 | 0.4 |
| Example 5 | 1.47 | 1.37 | 0.63 | 1.33 | 19.6 | 1.1 |
| Comparative Example 1 | 1.03 | 2.39 | 0 | — | 10.6 | 1.1 |
| Comparative Example 2 | 1.01 | 0.87 | 0.60 | −0.20 | 11.2 | 1.1 |
| Comparative Example 3 | 0.96 | 0.81 | 1.42 | −0.16 | 11.4 | 1.3 |
| Comparative Example 4 | 2.70 | 1.68 | 0 | — | 18.3 | 69.4 |

As shown in Table 1, high mobility of 15-20 cm²/Vs was obtained in Examples 1 to 5. It was also confirmed that the carrier concentration estimated from the OFF current had a sufficiently low value of $10^{13}$-$10^{14}$/cm³. Incidentally, it was confirmed based on powder X-ray diffraction that the oxide semiconductor in each of Examples and Comparative Examples had an amorphous structure.

Figure 2:
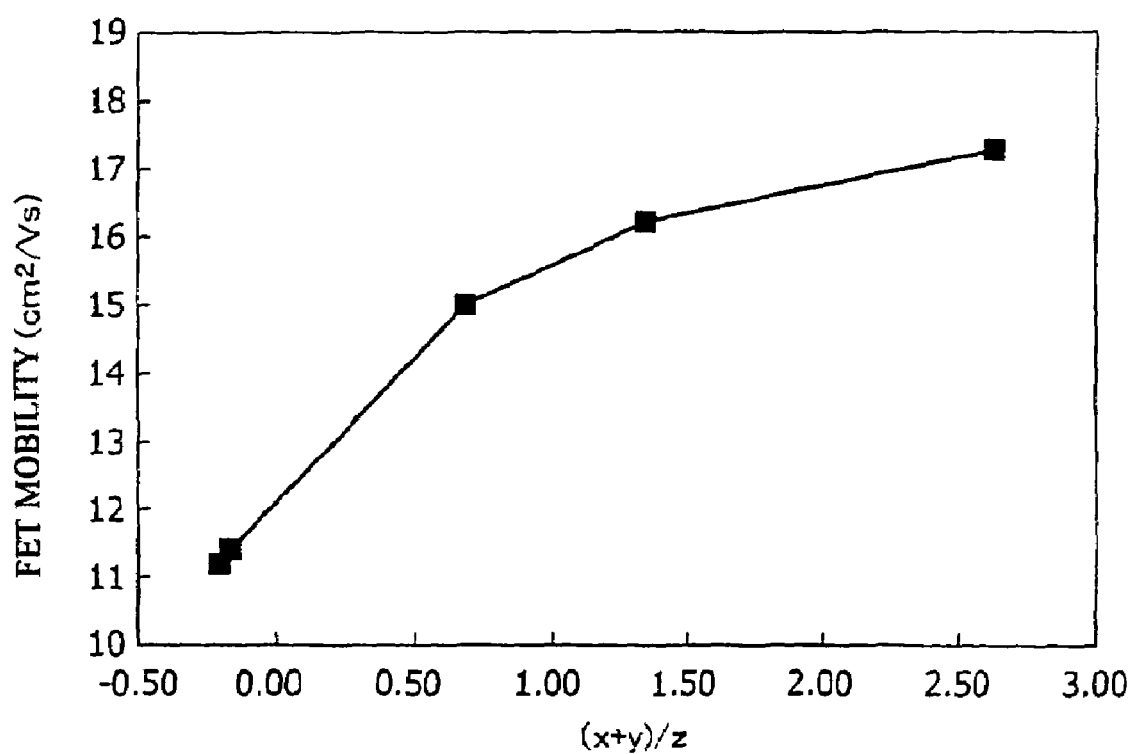
FIG. 2 is a graph showing the relation between film composition and FET mobility in an oxide semiconductor.

On the other hand, in Comparative Example 1 in which there was no Sn added and the ratio In/Ga was about 1, the OFF current was low and the mobility had still a low value of about 11 cm²/Vs. In Comparative Example 4 in which there was no Sn added and the ratio In/Ga was about 2.7, the mobility was improved to 18 cm²/Vs but the OFF current increased by two digits compared with Examples 1 to 3. Moreover, in Comparative Examples 2 and 3 in which Sn was added but the film composition (x+y)/z had a value smaller than 0.5, the OFF current was low and the mobility was also low like Comparative Example 1. That is, it was found that the mobility became remarkably large when the film composition (x+y)/z had a value of 0.5 or larger as shown in FIG. 2.

What is claimed is:

1. A thin film transistor comprising an oxide semiconductor composed of amorphous oxide represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, and $0.5 \leq (x+y)/z \leq 3$).

2. A thin-film transistor comprising an oxide semiconductor according to claim 1.

3. A method for producing an oxide semiconductor, comprising:

forming amorphous oxide represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, and $0.5 \leq (x+y)/z \leq 3$); and heat-treating the amorphous oxide under an oxidizing gas atmosphere.

4. A method for producing an oxide semiconductor according to claim 3, wherein the oxidizing gas at least contains oxygen radical, oxygen, water or ozone.

5. A method for producing a thin-film transistor, comprising:

forming amorphous oxide represented by general formula $In_{x+1}MZn_{y+1}Sn_zO_{(4+1.5x+y+2z)}$ (in which M=Ga or Al, $0 \leq x \leq 1$, $-0.2 \leq y \leq 1.2$, $z \geq 0.4$, and $0.5 \geq (x+y)/z \geq 3$) on a gate insulating film or on source and drain electrodes; and heat-treating the amorphous oxide under an oxidizing gas atmosphere.

* * * * *